United States Patent [19]

Ogawa

[11] Patent Number: 4,577,098
[45] Date of Patent: Mar. 18, 1986

[54] SOLID-STATE IMAGE SENSOR WITH A PHOTOTROPIC OR FLUORESCENT LAYER

[75] Inventor: Kazufumi Ogawa, Hirakata, Japan

[73] Assignee: Matsushita Electric Industrial Co., Ltd., Kadoma, Japan

[21] Appl. No.: 483,755

[22] Filed: Apr. 11, 1983

[30] Foreign Application Priority Data

Apr. 14, 1982 [JP] Japan .................................. 57-62763
Apr. 16, 1982 [JP] Japan .................................. 57-64326

[51] Int. Cl.[4] ............................................. H01J 3/14
[52] U.S. Cl. .................................... 250/216; 250/578; 350/354
[58] Field of Search ............................. 350/354, 331; 250/211 J, 578, 372, 332, 338 SE, 370 I, 370 G, 216; 357/31, 32, 24 LR; 358/902, 44

[56] References Cited

U.S. PATENT DOCUMENTS

| | | | |
|---|---|---|---|
| 3,774,173 | 11/1973 | Love et al. | 250/578 |
| 3,887,271 | 6/1975 | Yamaguchi et al. | 350/354 |
| 3,932,690 | 1/1976 | Gliemeroth | 350/354 |
| 4,051,374 | 9/1977 | Drexhage et al. | 250/370 G |
| 4,212,932 | 7/1980 | Calgari | 250/211 J |
| 4,285,007 | 8/1981 | Nakano et al. | 358/44 |
| 4,345,021 | 8/1982 | Ogawa et al. | 250/578 |

Primary Examiner—David C. Nelms
Assistant Examiner—J. Gatto
Attorney, Agent, or Firm—Cushman, Darby & Cushman

[57] ABSTRACT

A solid-state image sensor comprising:
  a phototropic layer disposed in front of a picture element area, and/or
  a fluorescent film disposed on a photo sensor in a picture element area, wherein
  the phototropic layer contains a photoreversible phototropic matter which reduces optical transmittance only at an irradiated portion when a light spot of high intensity is irradiated thereon, and the optical transmittance is rapidly restored when the light spot is put away, thereby improving the clarity of the picture signal against blooming or smear.

The fluorescent film absorbs a specified short wavelength spectral component of irradiated light and converts it to light of a longer wave-length, thereby improving the sensitivity of the short wave-length portion of said image sensor.

12 Claims, 9 Drawing Figures

SOLID-STATE IMAGE SENSOR WITH A PHOTOTROPIC OR FLUORESCENT LAYER

BACKGROUND OF THE INVENTION

1. Field of the Invention

The present invention relates to an improvement in a solid-state image sensor suitable to realize a compact type image pickup camera.

2. Description of the Prior Art

Recently, a signal reading system using a solid-state image sensor utilizing a CCD device, MOS device or CPD device has come into practical use. Further, a pile up type image sensor with a photoconductive film piled thereon has been developed for the respective above-mentioned signal reading methods.

But in each signal reading system, there is too much blooming. That is, excessively excited signal carriers are partially generated in an image pickup area where a spot light of high intensity is irradiated, and the signal carriers which generate blooming are diffused to an adjacent area, because the dynamic-range for incident light is narrow in each of the above-mentioned signal reading systems.

The prior art is elucidated with reference to the drawings FIG. 1 to FIG. 5, wherein FIG. 4 and FIG. 5 are response graphs for general prior art devices.

FIG. 1 is a plan view of a conventional solid-state color image sensor with a color filter thereon for general use.

FIG. 2 is a sectional view taken on line X—X' of the solid-state color image sensor of FIG. 1 when a spot light is irradiated thereon.

As shown in FIG. 1 and FIG. 2, for example, the conventional solid-state color image sensor comprises a picture element area 2 disposed on the center of a P-type semiconductor substrate 1. The picture element area 2 is formed by including photo sensors 12, such as photo diodes, for sensing an optical image of incident light Ⓐ irradiated thereon, and a device for transferring an optical signal, such as charge coupled device. A driving circuit area 3 is formed at the circumference of the picture element area 2, so as to drive the picture element area 2, and an insulation film 4 is disposed on the driving circuit area 3. A wiring conductor 6 and an electrode 7 for connecting a transparent electrode 9 are disposed on the insulation film 4. The wiring conductor 6 is connected to a terminal (not shown) of the driving circuit area 3 through an opening (not shown) of the insulation film 4 and extended to a pad 5 for external wiring. The photoconductive film 8 is, for example, a ZnSe—$Zn_{1-x}Cd_xTe$ or an amorphous silicon. A transparent electrode 9 is superposingly formed on the picture elements area 2. Further a color filter 11 is bonded or formed above the picture element area 2 by utilizing a bonding resin 10.

In case that the solid-state image sensor mentioned above is applied to an image sensor of a color camera, when an incident light Ⓐ shown in FIG. 2 of spot and high brightness is irradiated through a lens of the color camera to the solid-state image sensor, many carriers are generated in the photo element area 2 which includes the photo sensors 12. In case that the quantity of the generated signal carriers exceeds the signal charge transfer capacity, an excessive signal carrier Ⓑ is diffused to the photo element area 2 or a signal transferring area, both areas being within the circumference of the irradiated part, and accordingly the blooming occurs.

On the other hand, for producing a monoplate solid-state color image sensor, a mosaic shaped color filter or a striped color filter has to be disposed in front of the photo diodes.

FIG. 3 is a sectional view taken on line X—X' of a solid-state color image sensor of FIG. 1 with a detailed illustration for a color filter. In FIG. 3, every part corresponding to FIG. 2 is designated with the same reference numerals and marks. A color filter 11 comprises a glass plate 13 with a color filter layer 14 formed under the lower face thereof. The color filter 11 is bonded above the picture element area 2 by utilizing a bonding resin 10. In the case of another conventional device, the color filter layer 14 can be formed directly on an upper face of a photoconductive film 8 without utilizing a bonding resin.

But in the above-mentioned solid-state image sensor, the spectral transmittance characteristic of a color filter appears as shown in FIG. 4, in an example of a three color (R, G, B) system.

FIG. 4 is a graph of the characteristic curves showing spectral transmittance characteristics of a general color filter. In the graph, ordinate is graduated by optical transmittance (%), and the abscissa is graduated by wave-length (nm) of irradiated light. Referring to FIG. 4, it is recognized that only the hatched part of the irradiated light can reach the photo sensor and be effectively transduced to a photo current. That is to say, in the color image sensing system, the sensitivity of the system considerably decreases as a necessary consequence, in comparison with the monochrome image sensing system. Therefore, for developing the sensitivity of the color image sensing system, it is necessary to improve the optical sensitivity of the photo sensor, or to increase the signal amplification factor by improving the charge transferring efficiency, or to reduce the noise in a transferring area (not shown) and/or the driving area (not shown). But in the conventional semiconductor producing process (i.e. the process for producing a solid-state image sensor), it is difficult to realize enough noise reduction in the transferring area or the driving area.

On the other hand, for improving the blue light sensitivity, it is proposed that the diffusion depth of the photo diodes should be made shallow in the photo sensor with silicon photo diodes on a semiconductor substrate. And further, as an alternative, it is proposed that ZnSe—$Zn_{1-x}Cd_xTe$ or an amorphous silicon may be applied as the photoconductive film 8 instead of the silicon photo diodes.

But even by using the method mentioned above, only such a spectral sensitivity characteristics as shown in FIG. 5 is attainable, which is not satisfactory.

FIG. 5 is a graph of characteristic curves showing the spectral sensitivity characteristics of conventional photo sensors. In the graph, the ordinate is graduated by relative sensitivity (%), and abscissa is graduated by wave-length (nm) of irradiated light. A characteristic curve of the solid line shows the spectral sensitivity characteristic of a conventional solid-state image sensor with the ZnSe—$Zn_{1-x}Cd_xTe$ film. The characteristic curve of the dotted line shows a spectral sensitivity characteristic of another conventional solid-state image sensor performing photoelectric transducing only by silicon photo diodes in a semiconductor substrate without utilizing a photoconductive film.

As above-mentioned, even utilizing the ZnSe—Zn$_{1-x}$Cd$_x$Te film, only a little photocurrent is practically obtainable because of the decrease of the constituent of blue light (wave-length is 400–480 (nm)), and as a result, the sensitivity is generally low.

SUMMARY OF THE INVENTION

Therefore the present invention purposes to solve the above-mentioned problem of conventional solid-state image sensors, and to provide a new solid-state image sensor without blooming or smear.

The present invention further purposes to provide a solid-state color image sensor of high sensitivity which is able to obtain a fine color image even in the room light.

That is, in the solid-state image sensor of the present invention, the optical transmittance is reduced only at the portion of an image pickup area where a spot light of high intensity is irradiated thereon. Therefore, the image to be picked up is clearly picked-up with a sufficiently large aperture of the lens; that is, appropriate exposure to an image is attainable since there is no need for excessive lowering of the aperture.

Further, in the solid-state image sensor of the present invention, a larger photocurrent based on the constituent of blue light is obtainable, and the sensitivity is improved as a result of the whole color signal balance being improved. That is to say, in the present invention, a light through a blue light filter is converted to light of longer wave-length whereby photo diodes can be operated with high sensitivity, to thereby increase the photo current of the blue light component, hence increasing the whole sensitivity of the image sensor.

DESCRIPTION OF THE PREFERRED EMBODIMENTS

Figure 6:
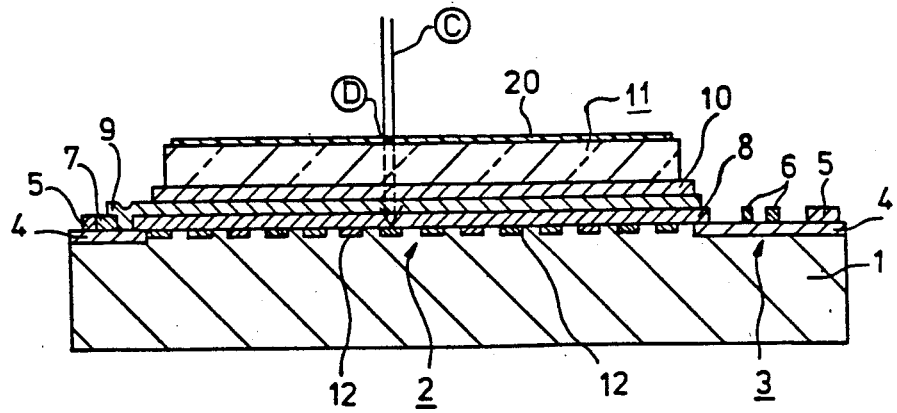
FIG. 6 is a sectional view of a solid-state color image sensor of an embodiment in accordance with the present invention.

Now the embodiments of the present invention will be elucidated with reference to the drawings FIG. 6 and thereafter.

Figure 1:
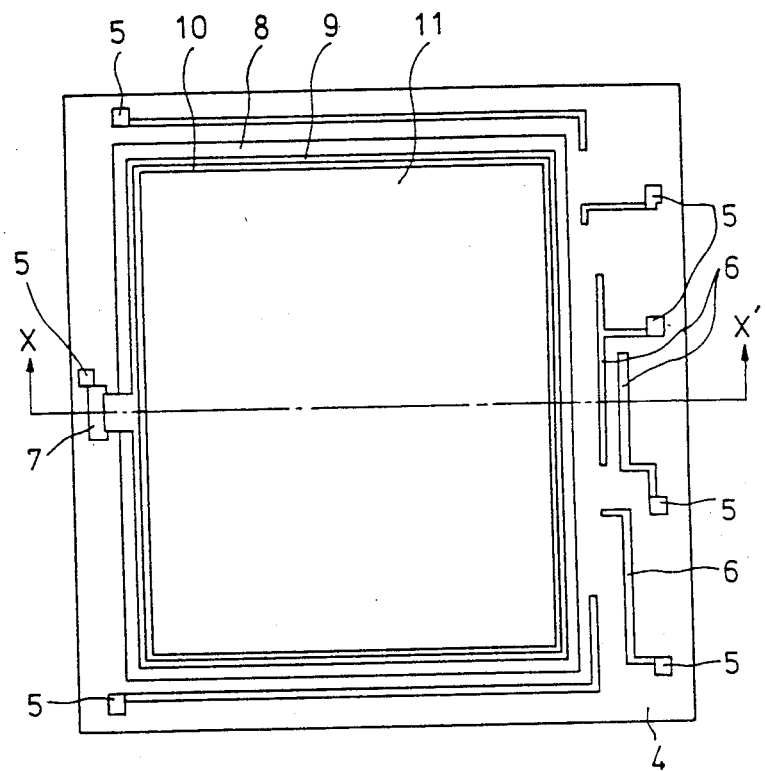
FIG. 1 is a plan view of a conventional solid-state color image sensor with a color filter thereon for general use.
Figure 2:
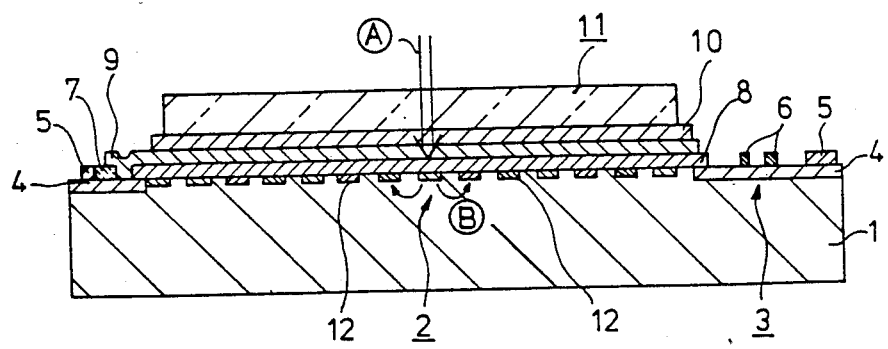
FIG. 2 is a sectional view taken on line X—X' of the solid-state color image sensor of FIG. 1 at the area where a spot light is irradiated thereon.
Figure 3:
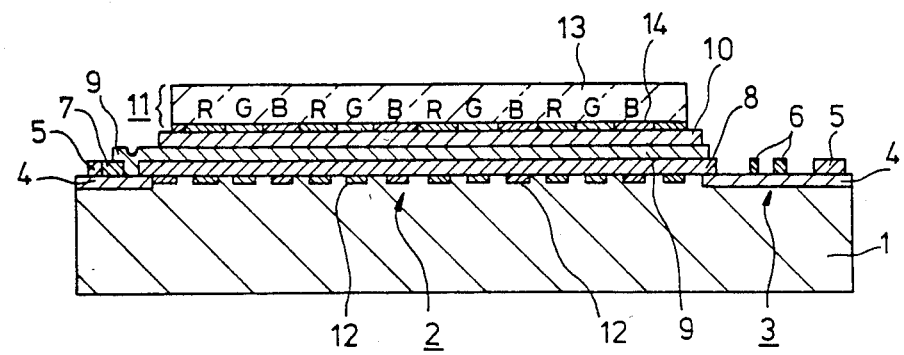
FIG. 3 is a sectional view taken on line X—X' of the solid-state color image sensor of FIG. 1 with detailed illustration of a color filter.
Figure 4:
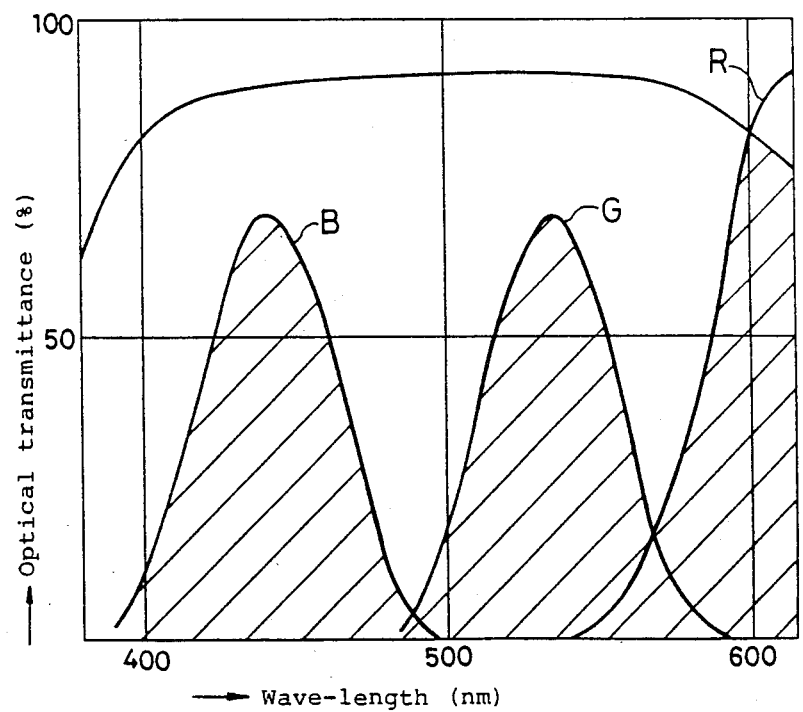
FIG. 4 is a graph of the characteristic curves showing the spectral transmittance characteristics of a conventional color filter.

FIG. 6 is a sectional view of a solid-state color image sensor of an embodiment in accordance with the present invention. In FIG. 6, every portion corresponding to that of FIG. 2 or FIG. 3 is designated by the same reference numerals and marks.

In the embodiment of the solid-state image sensor shown in FIG. 6, the optical transmittance is reduced only in the portion of an image pickup area where a spot light of high intensity is irradiated thereon. Therefore, there is no need to reduce the aperture of the lens to limit the light to stop the blooming or smear.

In an example, a phototropic layer 20 is formed by coating a photo-reversible phototropic matter, that is, for example a polynuclear conjugate aromatic compound or spiropirane-compound, on an upper face (i.e. main face) of a color filter 11. In another example (not shown), the phototropic layer is formed by absorbing the photo-reversible phototropic matter in a transparent resin layer previously coated on the upper face of the color filter. In still another example (not shown), the phototropic layer is formed by coating a resin layer containing a photo-reversible phototropic matter. That is to say, in any of the above-mentioned cases, the phototropic layer 20 is disposed in front of the picture element area 2, namely at the upper portion of the picture element area 2 as shown in FIG. 6.

In the case where the phototropic layer 20 is formed by adsorbing a 6-nitro-1',3',3'-trimethylspiro (2H-1-benzopyrane-2,2'-indorine) of the photo-reversible phototropic matter to a surface of a polycarbonate resin previously coated on the main face of the color filter 11, optical transmittance for an irradiated light of wave-length of about 555 (nm) is lowered to 5% or below at irradiation with intensity of 0.85 (nW/cm$^2$.S) from 90% at substantially zero intensity light. That is to say, when a spot light of high intensity Ⓒ is partially irradiated as shown in FIG. 6, a limited portion Ⓓ irradiated by the spot light reduces its optical transmitttance. Therefore an excessive carrier is not generated, and blooming or smear is effectively prevented. Further, in case that the spot light is moving in the image sensor surface, at parts where the spot light has been put away, the optical transmittance of the limited portion Ⓓ is rapidly restored to the original transparent level with its optical transmittance of over 90%. The solid-state image sensor shown in FIG. 6 is applicable for a solid-state video camera and makes it free from blooming or smear. The merits of the present invention mentioned above are expressly effective in the technical field of a monitor camera for receiving a spot light of high intensity for a lengthy period of time. In the embodiment shown in FIG. 6, the phototropic layer 20 is formed on the principal face of the color filter 11 and the phototropic layer 20 consists of a transparent resin film containing a photo-reversible phototropic matter as a component.

On the other hand, the phototropic layer 20 can be formed at a portion between the color filter 11 and the photo sensor (i.e. picture elements area 2).

In still other example, the phototropic layer can be formed by containing the photo-reversible phototropic matter in the glass plate 13 of the color filter 11. And in the above-mentioned case, the aforementioned effects of the present invention are obtainable as a necessary consequence.

Furthermore, in case the color filter layer 14 is formed directly on the substrate 1 without a bonding resin, the above-mentioned effects of the present invention are also obtainable by forming the phototropic layer on an upper or an under face of the color filter layer 14.

Figure 7A:
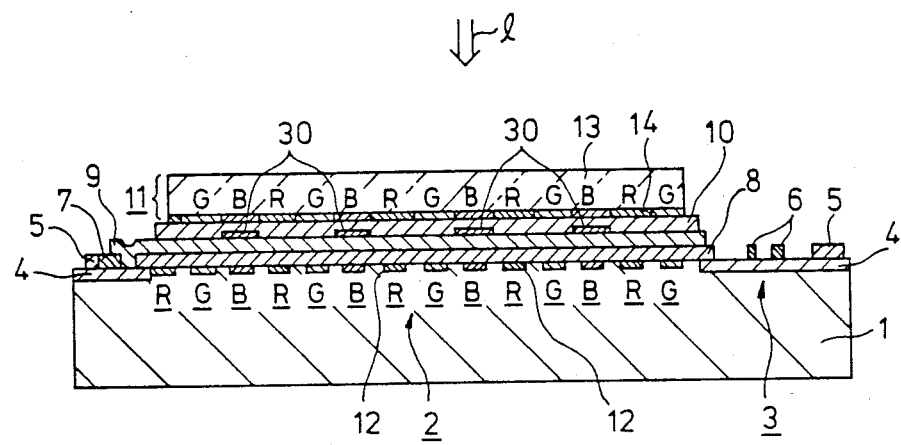
FIG. 7(a) is a sectional view of a solid-state color image sensor of another embodiment in accordance with the present invention.

FIG. 7(a) is a sectional view of a color solid-state image sensor of another embodiment in accordance with the present invention.

Figure 7B:
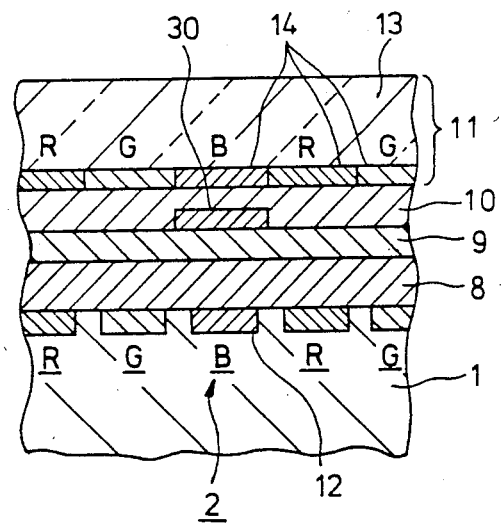
FIG. 7(b) is a fragmentary enlarged detail of FIG. 7(a).

And FIG. 7(b) is a fragmentary enlarged detail of FIG. 7(a).

In FIG. 7(a), each portion corresponding to that of FIG. 2 or FIG. 3 is designated by the same reference numerals and marks. In FIG. 7(b), each portion corresponding to that of FIG. 7(a) is designated by the same reference signs, respectively.

In the embodiment of the solid-state image sensor shown in FIG. 7(a) and FIG. 7(b), a larger photo current of the constituent blue light is obtainable, and the sensitivity can be advanced as a result of an improvement of the whole color signal balance. That is to say, in the embodiment of the present invention, wave-length of a light having passed through a blue light filter is shifted to a long wave-length band, wherein photo diodes can be operated with high sensitivity, and the photo current of the blue light component is increased, so that the whole sensitivity of the image sensor can be advanced.

In the example case shown in FIG. 7(a) and FIG. 7(b), crystalline fluorescent films 30 are formed at portions above photo diodes 12 (designated by reference sign "B" in particular). Each of the above-mentioned portions are formed to correspond to blue filters "B", "B" having a pass-band of 420 to 470 (nm). The crystalline fluorescent film 30 comprises silicate, phosphate or sulfide, and the fluorescent film 30 is transparent for incident light of wave-length within a specified wave-length band, such as 500 nm-1000 nm. The reference mark 1 designates an irradiated light. In case silver doped zinc sulfide—cadmium sulfide is applied as the crystalline fluorescent film 30, the fluorescent film 30 absorbs a consituent of the irradiated light of wave-length shorter than the specified band, and radiates a fluorescent radiation light with wave-length longer than that of absorbed light. In other words, the fluorescent film 30 converts the wave-length of light. The a wave-length of the fluorescent radiation light can be controlled as shown in a graph of FIG. 8.

Figure 5:
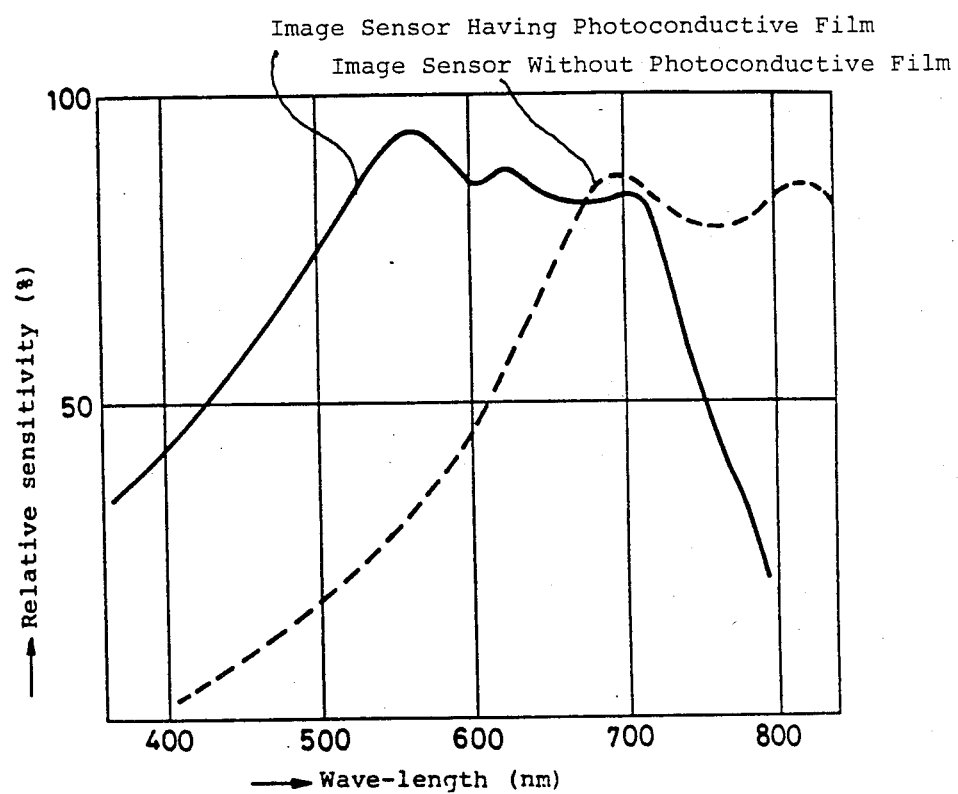
FIG. 5 is a graph of the characteristic curves showing the spectral sensitivity characteristics of conventional photo sensors.
Figure 8:
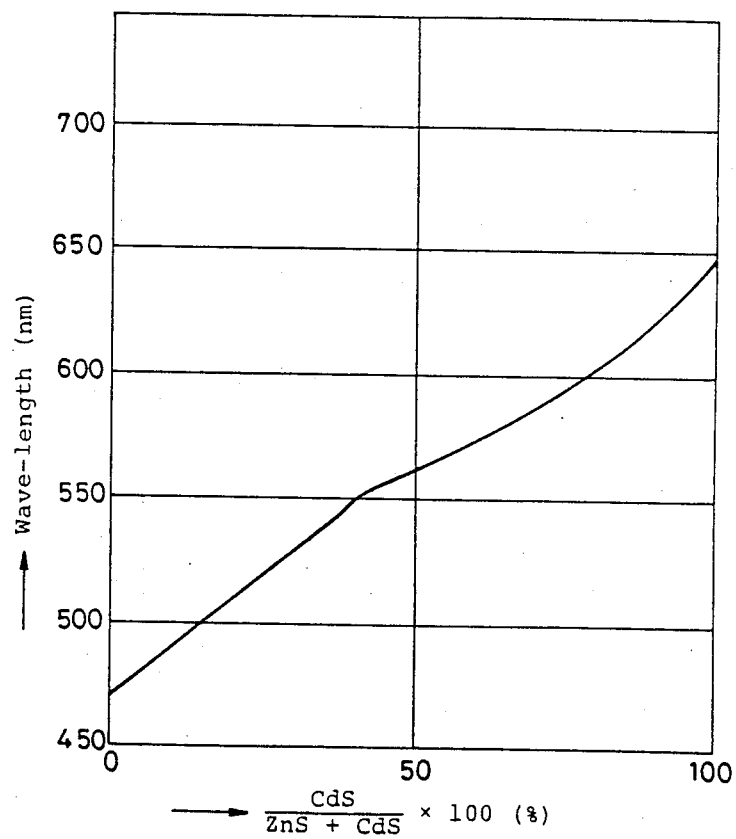
FIG. 8 is a graph of a characteristic curve showing the relationship between the wave-length of the fluorescent radiation light and CdS concentration of silver doped fluorescent film in an embodiment shown in FIG. 7(a) and FIG. 7(b) in accordance with present invention.

FIG. 8 is a graph of a characteristic curve showing a relationship between wave-length of the fluorescent radiation light and CdS concentration of silver doped fluorscent film in an embodiment in accordance with present invention shown in FIG. 7(a) and FIG. 7(b). In the graph, the oridnate is graduated by wave-length (nm) of the fluorescent radiation light, and obsciassa is graduated by the formation ratio (%) of CdS to (ZnS+CdS) in the crystalline fluorescent film. As is recognized from the graph of FIG. 8, the wave-length of the fluorescent radiation light is 550 (nm) at the CdS concentration of 40%. On the other hand, as shown in the graph of FIG. 5, the photosensitivity of the $ZnSe-Zn_{1-x}Cd_xTe$ film takes its maximum level at the wave-length of 550 (nm) of the irradiated light, that is, green light wave-length. That is to say, in case that the $ZnSe-Zn_{1-x}Cd_xTe$ film is applied to the photo sensor, the wave-length of light having passed through the blue filter "B" (band width: 420 to 470 (nm)) disposed above the photo sensor "B" can be transduced by the fluorscent film 30, as the transduced wave-length corresponds with the green light wave-length which can bring the maximum sensitivity for the $ZnSe-Zn_{1-x}Cd_xTe$ film. In the above-mentioned case, sensitivity of the solid-state color image sensor can be improved about twice as high as the conventional case utilizing blue light as it is. In case that a silicon diode is applied to the photo sensor, the sensitivity of the solid-state color image sensor can be improved about treble as high as the conventional case. In addition, the remaining light components which are not transduced by the fluorescent film 30 passes through the fluorescent film 30 as it is, and reaches the photo sensor, therefore there is no substantial waste of light. It is obvious that a solid-state color image sensor of high sensitivity can be realized by forming the color filter directly on the photo sensor or by bonding the color filter either upon or over the photo sensor thrugh utilizing a bonding resin.

As mentioned above, in the solid-state image sensor of the present invention, a light having passed through the color filter is transduced to a fluorescent radiation light bringing a high sensitivity for the photo sensor. As a result, the sensitivity of the solid-state image sensor can be improved by a large margin.

In the above-mentioned case, a light having passed through the blue filter is transduced to a light belonging to the green light band. On the other hand, in case a silicon is applied to the photo sensor, it is obvious that a blue light or a cyanic light should be transduced rather to a red band light.

In addition, for applying the present invention to the solid-state monochrome image sensor, the fluorescent film should be formed all over the surface of the picture element area, and the sensitivity can be advanced. In case of the silicon diodes applied to the photo sensor as shown in FIG. 3, the sensitivity is very low at the visible band (wave-length of 400 to 600 (nm)). But even in this case, by applying CdS (90%) as the fluorescent film, an irradiated light of visible band can be transduced to a fluorescent radiation light with its wave-length of 625 (nm), thereby bringing a high sensitivity of the photo sensor, and the sensitivity of the solid-state monochrome image sensor can be advanced by a large margin.

In the present invention, it is obvious that both the embodiments shown in FIG. 6 and FIG. 7(a) can be utilized in combination.

What is claimed is:

1. A solid state image sensor comprising:
    a picture element area including a photosensor array and a signal read out circuit;
    a phototropic layer disposed in front of said picture element area;
    the optical transmittance of said phototropic layer being reduced only at that portion thereof receiving a spot of high intensity light and said optical transmittance being rapidly restored to a normal transparent level when said spot of high intensity light is removed therefrom.

2. A solid-state image sensor in accordance with claim 1, wherein
    a color filter is disposed in front of said picture element area, and
    said phototropic layer is disposed on or below said color filter.

3. A solid-state image sensor in accordance with claim 1, wherein
 a color filter is disposed in front of said picture element area, and the color filter functions as said phototropic layer by containing a photo-reversible phototropic matter.

4. A solid-state iamge sensor in accordance with claim 1, wherein
 a photoconductive film is disposed on said picture element area.

5. A solid-state image sensor in accordance with claim 4, wherein
 said photoconductive film comprises a ZnSe—Zn$_{1-x}$Cd$_x$Te or an amorphous silicon.

6. A solid-state image sensor in accordance with claim 1, wherein
 said phototropic layer comprises a polynuclear conjugate aromatic compound or spiropirane-compound.

7. A solid-state image sensor comprising:
 a fluorescent film disposed on a photosensor in a picture element area, the fluorescent film being transparent to green and red bands and the fluorescent film absorbing a blue cyan band and emitting a fluorescent radiation light with a wave-length longer than that of the absorbed light, said fluorescent film being disposed only between a blue or cyan filter and said photosensor.

8. A solid-state image sensor comprising:
 a phototropic layer on a photosensor in a picture element area, and
 a fluorescent film disposed on a photosensor in a picture element area, the fluorescent film being transparent to green and red bands and the fluorescent film absorbing a blue or cyan band and emitting a fluorescent radiation light with a wavelength longer than that of the absorbed light, said fluorescent film being disposed only between a blue or cyan filter and said photosensor.

9. A solid-state image sensor in accordance with claim 8, wherein
 said photo sensor comprises a ZnSe—Zn$_{1-x}$Cd$_x$Te or an amorphous silicon.

10. A solid-state image sensor in accordance with claim 7 or 8, wherein
 said fluorescent film transduces a blue band light to a green band light.

11. A solid-state image sensor in accordance with claim 7 or 8, wherein
 said fluorescent film transduces a blue band light to a red band light.

12. A solid-state image sensor in accordance with claim 7 or 8, wherein
 said fluorescent film is disposed as a teasellated pattern.

* * * * *